(12) United States Patent
Wang et al.

(10) Patent No.: US 10,192,612 B2
(45) Date of Patent: *Jan. 29, 2019

(54) MEMORY CELL OF STATIC RANDOM ACCESS MEMORY BASED ON RESISTANCE HARDENING

(71) Applicant: Institute of Automation Chinese Academy of Sciences, Beijing (CN)

(72) Inventors: Jingqiu Wang, Beijing (CN); Li Liu, Beijing (CN); Liang Chen, Beijing (CN)

(73) Assignee: Institute of Automation Chinese Academy of Sciences, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/550,898

(22) PCT Filed: Mar. 27, 2015

(86) PCT No.: PCT/CN2015/075321
§ 371 (c)(1),
(2) Date: Aug. 14, 2017

(87) PCT Pub. No.: WO2016/154826
PCT Pub. Date: Oct. 6, 2016

(65) Prior Publication Data
US 2018/0025774 A1    Jan. 25, 2018

(51) Int. Cl.
*G11C 11/417* (2006.01)
*G11C 11/413* (2006.01)
*G11C 11/412* (2006.01)

(52) U.S. Cl.
CPC .......... *G11C 11/417* (2013.01); *G11C 11/412* (2013.01); *G11C 11/413* (2013.01); *G11C 11/4125* (2013.01)

(58) Field of Classification Search
CPC ..................................................... G11C 11/417
(Continued)

(56) References Cited

U.S. PATENT DOCUMENTS 6,259,643 B1 * 7/2001 Li ....................... G11C 11/4125
                                                365/194
6,998,722 B2 * 2/2006 Madurawe ............ G11C 11/412
                                                257/66
(Continued)

FOREIGN PATENT DOCUMENTS

CN      104157303 A     11/2014
CN      104157304 A     11/2014
(Continued)

OTHER PUBLICATIONS

PCT/CN2015/075321 International Search Report.

*Primary Examiner* — Fernando Hidalgo
(74) *Attorney, Agent, or Firm* — Howard IP Law, PLLC; Jeremy Howard

(57) ABSTRACT

The present invention provides a memory cell of a static random access memory based on resistance reinforcement, which includes a latch circuit and a bit selection circuit. The latch circuit consists of two PMOS transistors P1 and P2, two NMOS transistors N1 and N2, a first resistance-capacitance network and a second resistance-capacitance network. The bit selection circuit consists of NMOS transistors N5 and N6. The latch circuit form four storage nodes X1, X1B, X2, X2B. Compared to the conventional memory cell of a 6T structure, a resistance-capacitance network is added, so that without changing the original read operation circuit and without obviously increasing complexity, the memory cell is prevented from having single event upset at a cost of increasing a small amount of area, thus ensuring correctness of data.

9 Claims, 4 Drawing Sheets

(58) Field of Classification Search
USPC .......................................................... 365/154
See application file for complete search history.

(56) References Cited

U.S. PATENT DOCUMENTS

| | | | |
|---|---|---|---|
| 2009/0034312 A1 | 2/2009 | Lawrence | |
| 2011/0026315 A1 | 2/2011 | Lawrence | |
| 2012/0120704 A1* | 5/2012 | Lawson | ............. G11C 11/4125 |
| | | | 365/72 |

FOREIGN PATENT DOCUMENTS

| | | |
|---|---|---|
| CN | 104318953 A | 1/2015 |
| CN | 104464796 A | 3/2015 |
| WO | 0074064 A | 12/2000 |

* cited by examiner

MEMORY CELL OF STATIC RANDOM ACCESS MEMORY BASED ON RESISTANCE HARDENING

TECHNICAL FIELD

The Present invention relates to the technology of design and manufacturing of integrated circuits, in which a static random access memory is involved, and in particular to a memory cell of a static random access memory based on resistance hardening, which can be applied in military and civilian affairs and in the field of spaceflight for commercial purpose, especially the invention is suitable for applications of high-performance and high-density anti-radiation.

BACKGROUND OF THE INVENTION

Single event upset is an important parameter of radiation reinforcement. One-time single event upset or soft error refers to a non-destructive data transformation on a data storage bit. Charged particles (such as cosmic rays or trapped protons) are incident into a semiconductor device and quickly lose their energies because of interaction with semiconductor materials. The energies lost enable the electrons to jump from a valence band to a conduction band, thus the conduction band has electrons and the valence band has holes, forming electron-hole pairs, which leads to unbalanced carriers. When there is no electric field, the unbalanced carriers will diffuse, recombine and finally disappear. When there is an electric field, the unbalanced carriers (electron-hole pairs) will separate and be collected by electrodes to form transient current. The transient current will change the node potential and cause a turnover of the logical state of the device; or the transient current will propagate along a signal transmission path, thus interfering the normal function of the circuit. For a memory cell of CMOS SRAM, the reverse-biased PN junction space charge region in the drain region of an off-state transistor becomes the single event upset sensitive region of the device, whose electric field is strong enough to make the electron-cavity pairs separated and collected by electrodes.

Currently, a typical memory cell has a 6T structure. As shown in FIG. 1, a 6T SRAM unit includes two identical inverters in cross connection, which form a latch circuit, namely, an output of one inverter is connected to an input of another inverter. The latch circuit is connected between a power supply and a ground potential. Each inverter comprises an NMOS pull-down transistor N1 or N2 and a PMOS pull-up transistor P1 or P2. Outputs of the inverter are two storage nodes Q and QB. When one of the storage nodes is pulled down to a low voltage, the other storage node will be pulled up to a high voltage, thus forming a complementary pair. A pair of complementary bit lines BL and BLB are connected to the storage nodes Q and QB via a pair of transmission gate transistors N3 and N4. Gates of the transmission gate transistors N3 and N4 are connected to a word line WL.

Suppose that the state of the memory cell is "1", namely, Q is a high level and QB is a low level, P1 and N2 transistors are turned on and N1 and P2 transistors are turned off, and a reverse-biased PN junction space charge region in the drain regions of N1 and P2 transistors is the single event upset sensitive region of the device. With respect to N1 transistor, the transient current causes the voltage of the drain (i.e. Q storage point) to drop and be coupled to gates of P2 and N2, thus turning off N2 transistor and turning on P2 transistor, voltage of the drain (i.e. QB storage point) of N2 transistor is raised and fed back to gates of P1 and N1 transistors, thus turning off P1 transistor and turning on N1 transistor, and the state of the memory cell changes thoroughly from "1" into "0". That is, in a radiation environment, single event upset is liable to occur in the memory cell with a 6T structure, which influences the contents stored, and the wrong value will remain until the memory cell is rewritten next time.

In order to solve the problem of single event upset in the memory cell caused by high-energy particles (high-energy protons, heavy ions) hitting the storage node, usually the two measures of process reinforcement and circuit design reinforcement are adopted. There are usually three methods for circuit design reinforcement. The first method is to add a capacitance or resistance delay element in a storage node of the memory cell, as shown in FIG. 2 and FIG. 3. When the incidence of charged particles causes a potential of the drain of N1 transistor to drop to a low voltage while P1 transistor is still on, the memory cell is in an unstable state, and there is a contention between two processes. On the one hand, a power supply charges a gate capacitor of N2 transistor through P1 to cause the drain voltage of N1 transistor to rise and thus restore to the initial state; on the other hand, the drain voltage of N1 transistor drops to couple to another inverter gate, and is then fed back to turn on N1 transistor and turn off P1 transistor, thus the state of the memory cell is reversed. By increasing RC delay, the transient current delays the time of overturning the logical circuit, thus allowing the node voltage change caused by the peak transient current to have time to restore to the initial value. Disadvantages of said method include a large resistance-capacitance value is needed on the chip, the area of the resistance-capacitance is too large, and the time of write increases greatly. The second method is to add coupling capacitors between two storage nodes, as shown in FIG. 4. The principle of said method is that when one of the nodes is hit by high-energy particles, the transient current generated makes the voltage of one of the nodes to jump, and the voltage of the other node jumps in the same direction under the influence of the coupling capacitors, so that the memory cell cannot be reversed. This method is also limited by the difficulty and area of manufacturing the capacitor and by the time of write. The third method is to use a multi-transistor element to realize redundant preservation of the stored information, as shown by the 12T DICE structure in FIG. 5. Four inverters are connected end to end, wherein the storage nodes are respectively connected to NMOS of the previous stage and to PMOS of the subsequent stage, so that both forward and backward storage data are redundantly preserved, and once a certain storage node has single event upset, the connected node voltage will only influence storage nodes of the previous or subsequent stage, and the stage that is not influenced restores information on the jumped storage node. The disadvantages of said method include requiring too many transistors and occupying too large an area.

SUMMARY OF THE INVENTION

The object of the present invention is to provide a memory cell of a static random access memory based on resistance reinforcement, and only by increasing a small amount of area without increasing complexity, the memory cell can be prevented from having a state reverse when being hit by particles, thus ensuring correctness of data.

The memory cell of a static random access memory based on resistance reinforcement provided by the present invention comprises a latch circuit and a bit selection circuit, the latch circuit consists of two PMOS transistors P1 and P2, two NMOS transistors N1 and N2, a first resistance-capacitance network and a second resistance-capacitance network; the bit selection circuit consists of NMOS transistors N5 and N6; the latch circuit forms four storage nodes X1, X1B, X2, X2B;

a drain of P1 is connected to X1, a source thereof is connected to a power supply, and a gate thereof is connected to X1B; an input terminal and an output terminal of the first resistance-capacitance network are connected to X1 and X2, respectively, a drain of N1 is connected to X2, a source thereof is connected to the ground, and a gate thereof is connected to X2B;

a drain of P2 is connected to X1B, a source thereof is connected to a power supply, and a gate thereof is connected to X1; an input terminal and an output terminal of the second resistance-capacitance network are connected to X1B and X2B, respectively, a drain of N2 is connected to X2B, a source thereof is connected to the ground, and a gate thereof is connected to X2;

a drain of N5 is connected to X2 or X1, a drain of N6 is accordingly connected to X2B or X1B; a source of N5 is connected to a bit line BL; a source of N6 is connected to a complementary bit line BLB; gates of N5 and N6 are connected to each other and are connected to a word line WL.

The first resistance-capacitance network consists of R1 and C1, and the second resistance-capacitance network consists of R2 and C2;

two terminals of R1 are connected to X1 and X2, respectively; and one terminal of C1 is connected to X1, the other terminal thereof is connected to the ground;

two terminals of R2 are connected to X1B and X2B, respectively; and one terminal of C2 is connected to X1B, the other terminal thereof is connected to the ground.

The resistance-capacitance network may also be formed in the following manner: the first resistance-capacitance network consists of a PMOS transistor P3 and an NMOS transistor N3 that are always on so as to act as resistance-capacitance isolation nodes, and the second resistance-capacitance network consists of a PMOS transistor P4 and an NMOS transistor N4 that are always on so as to act as resistance-capacitance isolation nodes;

a storage node X3 is formed between P3 and N3; a storage node X3B is formed between P4 and N4;

a source of P3 is connected to X1, a drain thereof is connected to X3, a gate thereof is connected to the ground, and a substrate thereof is connected to a power supply, so that it is always on; a drain of N3 is connected to X3, a source thereof is connected to X2, a gate thereof is connected to a power supply and a substrate thereof is connected to the ground, so that it is always on;

a source of P4 is connected to X1B, a drain thereof is connected to X3B, a gate thereof is connected to the ground, and a substrate thereof is connected to a power supply, so that it is always on; a drain of N3 is connected to X3B, a source thereof is connected to X2B, a gate thereof is connected to a power supply and a substrate thereof is connected to the ground, so that it is always on.

The present invention has a resistance-capacitance network added in a memory cell of 6T structure, so that the circuit area overhead is reduced, a good performance in overcoming single event upset is achieved, and it is compatible with the universal technology.

DETAILED DESCRIPTION OF THE PREFERRED EMBODIMENTS

To make the object, technical solution and advantages of the present invention clearer, the present invention is described in further detail below in conjunction with specific embodiments and with reference to the drawings.

Embodiment 1

Figure 1:
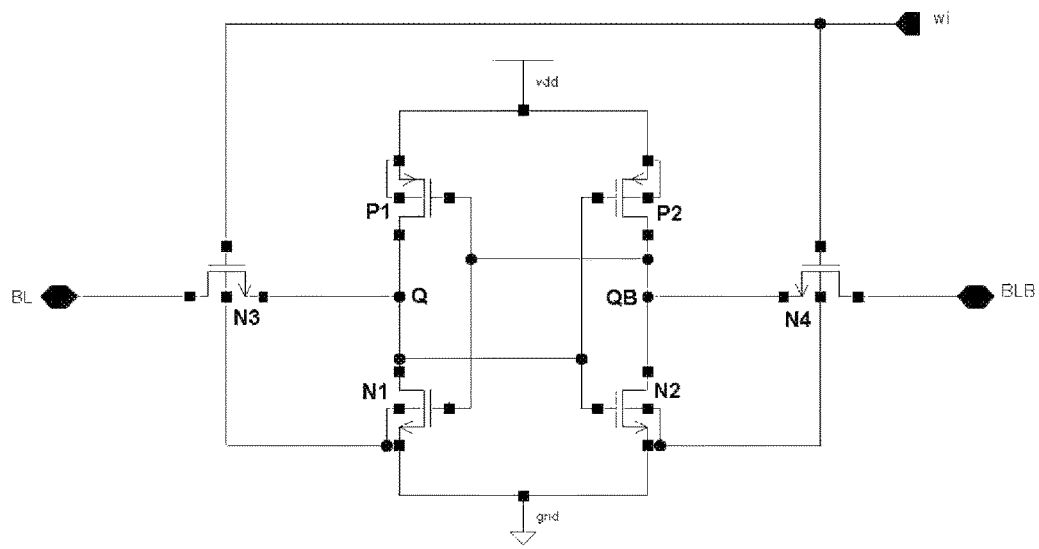
FIG. 1 is a conventional 6T SRAM memory cell.
Figure 2:
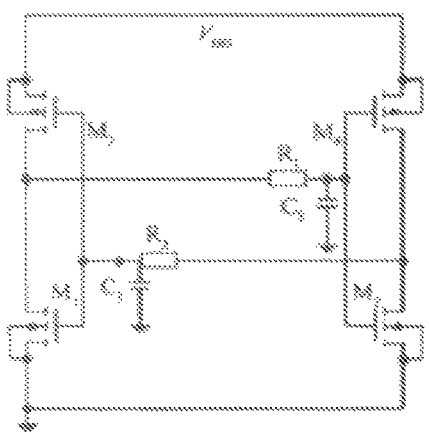
FIG. 2 is a memory cell with storage nodes and resistance-capacitors.
Figure 3:
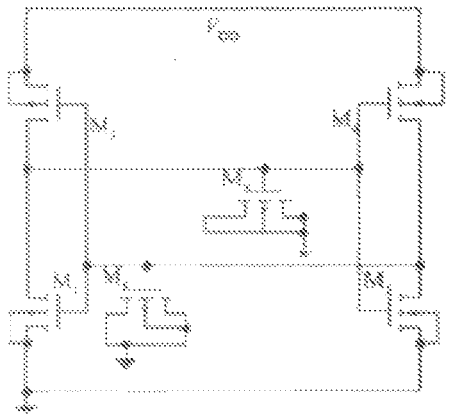
FIG. 3 is a memory cell with resistance-capacitors replaced by mos capacitors.
Figure 4:
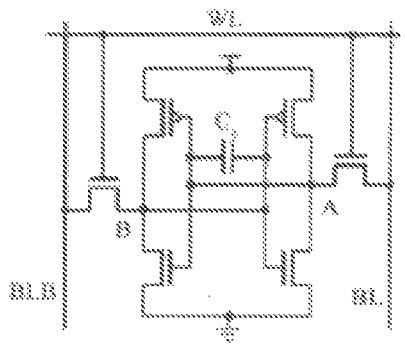
FIG. 4 is a memory cell with storage nodes and coupling capacitors.
Figure 5:
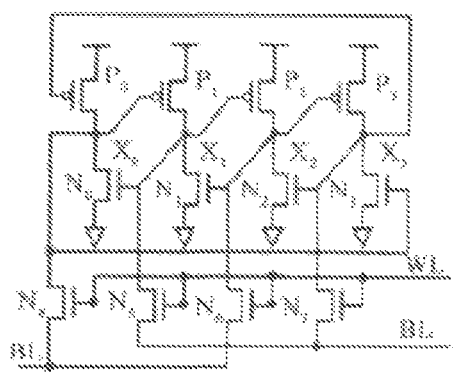
FIG. 5 is a memory cell having a DICE structure.
Figure 6:
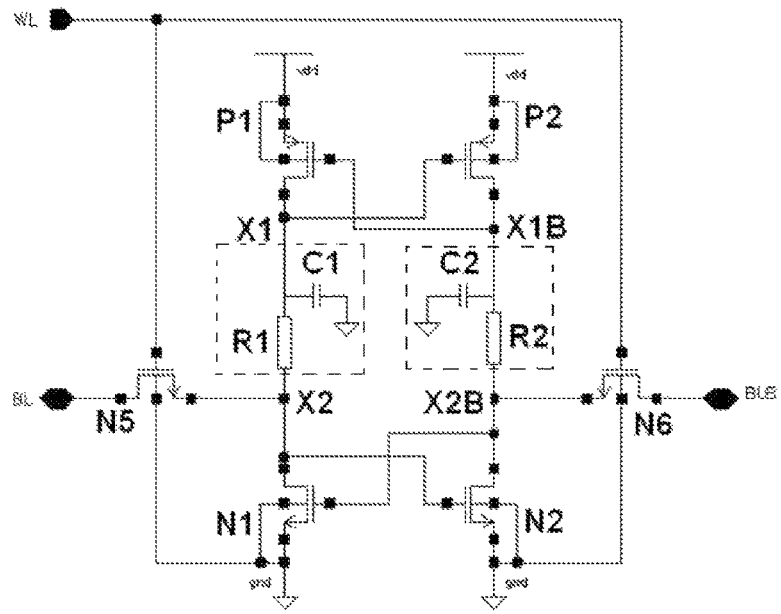
FIG. 6 is a circuit diagram of a first embodiment of the present invention.

As shown in FIG. 6, a memory cell of a static random access memory based on resistance reinforcement according to the present invention comprises a latch circuit and a bit selection circuit, the latch circuit consists of two PMOS transistors P1 and P2, two NMOS transistors N1 and N2, a first resistance-capacitance network consisting of R1 and C1, and a second resistance-capacitance network consisting of R2 and C2; the bit selection circuit consists of NMOS transistors N5 and N6; the latch circuit forms four storage nodes X1, X1B, X2, X2B.

A drain of P1 is connected to X1, a source thereof is connected to a power supply, and a gate thereof is connected to X1B; two terminals of R1 are connected to X1 and X2, respectively, one terminal of C1 is connected to X1 and the other terminal is connected to the ground; a drain of N1 is connected to X2, a source thereof is connected to the ground, and a gate thereof is connected to X2B.

A drain of P2 is connected to X1B, a source thereof is connected to a power supply, and a gate thereof is connected to X1; two terminals of R2 are connected to X1B and X2B, respectively, one terminal of C2 is connected to X1B and the other terminal is connected to the ground; a drain of N2 is connected to X2B, a source thereof is connected to the ground, and a gate thereof is connected to X2.

A drain of N5 is connected to X2, a drain of N6 is accordingly connected to X2B; a source of N5 is connected to a bit line BL; a source of N6 is connected to a complementary bit line BLB; gates of N5 and N6 are connected to each other and are connected to a word line WL.

If high-energy particles pass through said memory cell, sensitive nodes of the MOS transistor collect charges to form a transient current causing a voltage change, then said change, on one hand, turns off a corresponding MOS transistor in complementary inverters, and on the other hand, only by coupling to the gates of the complementary inverters after being delayed by RC, said change can reverse the state of the inverter. Suppose that the memory in FIG. 6 stores a high level, namely, X1="1", X2="1", while X1B="0", X2B="0", then the sensitive nodes of said cell are the drain of N1 transistor, i.e. X2, and the drain of P1 transistor, i.e.

X1B. Only when X2 or X1B is hit by the particles, will a transient current be generated, which causes a voltage change. If particles pass through X2, X2 changes from "1" into "0", and the originally on N2 transistor is turned off, so that "0" of X2B floats; on the other hand, a voltage change at X2 requires the RC delay to turn on the originally off P2 transistor, such that X1B changes from "0" into "1", and P1 transistor is completely turned off, so that the memory cell is reversed. If said RC delay is long enough, before turning on P2 transistor, P1 transistor have the time to maintain X1 to be "1" so as to prevent reverse of the cell. Meanwhile, since a bit selection signal is connected to X2 and X2B, the read operation delay of the cell is not influenced.

Embodiment 2

This embodiment differs from embodiment 1 by circuit designs of the first resistance-capacitance network and the second resistance-capacitance network, while the rest parts are the same as those in embodiment 1.

Figure 7:
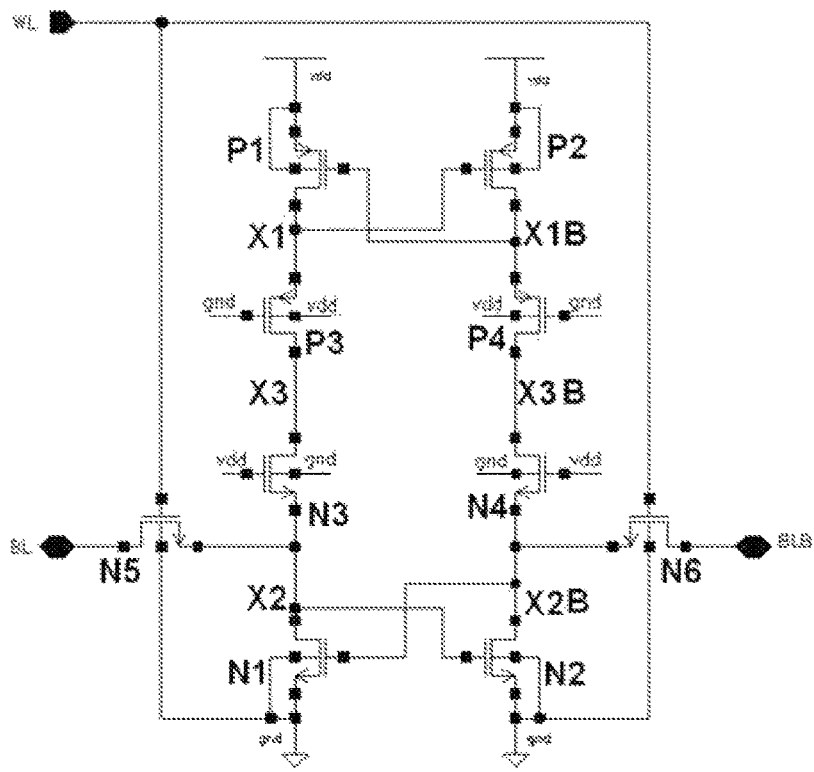
FIG. 7 is a circuit diagram of a second embodiment of the present invention.

As shown in FIG. 7, the first resistance-capacitance network consists of a PMOS transistor P3 and an NMOS transistor N3 that are always on so as to act as resistance-capacitance isolation nodes, and the second resistance-capacitance network consists of a PMOS transistor P4 and an NMOS transistor N4 that are always on so as to act as resistance-capacitance isolation nodes; the always-on P3, P4, N3 and N4 redundantly preserve information of the storage nodes and form six storage nodes including X1, X1B, X2, X2B, X3 and X3B.

A source of P3 is connected to X1, a drain thereof is connected to X3, a gate thereof is connected to the ground, and its substrate is connected to a power supply, so that it is always on; a drain of N3 is connected to X3, a source thereof is connected to X2, a gate thereof is connected to a power supply and a substrate thereof is connected to the ground, so that it is always on.

A source of P4 is connected to X1B, a drain thereof is connected to X3B, a gate thereof is connected to the ground, and its substrate is connected to a power supply, so that it is always on; a drain of N3 is connected to X3B, a source thereof is connected to X2B, a gate thereof is connected to a power supply and a substrate thereof is connected to the ground, so that it is always on.

Bit selection circuits N5 and N6 are connected to storage nodes X2 and X2B, respectively.

If the voltage of one storage node jumps, the two always-on transmission transistors function as resistor and capacitor to perform RC delay to the jumped signal, therefore, the pull-up PMOS or pull-down NMOS can have time to restore said jumped signal to its initial value.

Charge collection sensitive regions are regions in which strong electric fields are resulted from reverse biasing of PN junctions in the MOS transistor. When particles hit said regions, ionized electron-hole pairs are separated under the effect of electric fields and are collected by electrodes to form transient current. As shown in the structure of FIG. 7, if the memory cell stores a low level, i.e. X1="0", X3="0", X2="0", X1B="1", X3B="1", X2B="1". A source body PN junction of P3 is reversely biased, a drain body PN junction thereof is reverse-biased, and a drain body PN junction of P1 is reverse-biased. Thus, when particles hit the device, the transient current will be generated only when the source X1 of P3, the drain X3 of P3 or the drain X1 of P1 is hit. Likewise, the transient current will be generated only when X3 and X2B are hit. That is, sensitive nodes of said structure are X1 (reversed from "0" into "1", X3 (reversed from "0" into "1"), X3B (reversed from "1" into "0"), X2B (reversed from "1" into "0").

In the above analysis, there are four sensitive nodes, namely X1 (reversed from "1" into "1"), X3 (reversed from "1" into "1"), X3B (reversed from 1 into "0") and X2B (reversed from 1" into "0"); wherein the change of node X1 being reversed from "0" into "1" can turn on N2 only through RC delays of two resistors, while the change of X3 being reversed from "0" into "1" can turn on N1 through one RC delay; wherein the change of node X2B being reversed from "1" into "0" can turn on P1 only through RC delays of two resistors, while the change of X3B being reversed from "1" into "0" can turn on P1 through one RC delay. Thus the change of X3 being reversed from "0" into "1" or change of X3B being reversed from "1" into "0" is more "dangerous". When X3 is reversed from "0" into "1", because of the RC delay caused by N3, said cell can use this time to restore the signal jumped from "0" to "1" at X3 to its initial value through the always-on N1; or when X3B is reversed from "1" into "0", because of the RC delay caused by P4, said cell can use this time to restore the signal jumped from "1" to "0" at X3B to its initial value through the always-on P2.

The cell uses the MOS transistor as the resistance-capacitance network, and it is compatible with the universal MOS technology, so it can be easily manufactured and is easily implementable.

Embodiment 3

This embodiment differs from embodiment 2 by the storage nodes connected to the bit selection circuit, while the rest parts are the same as those in embodiment 2.

Figure 8:
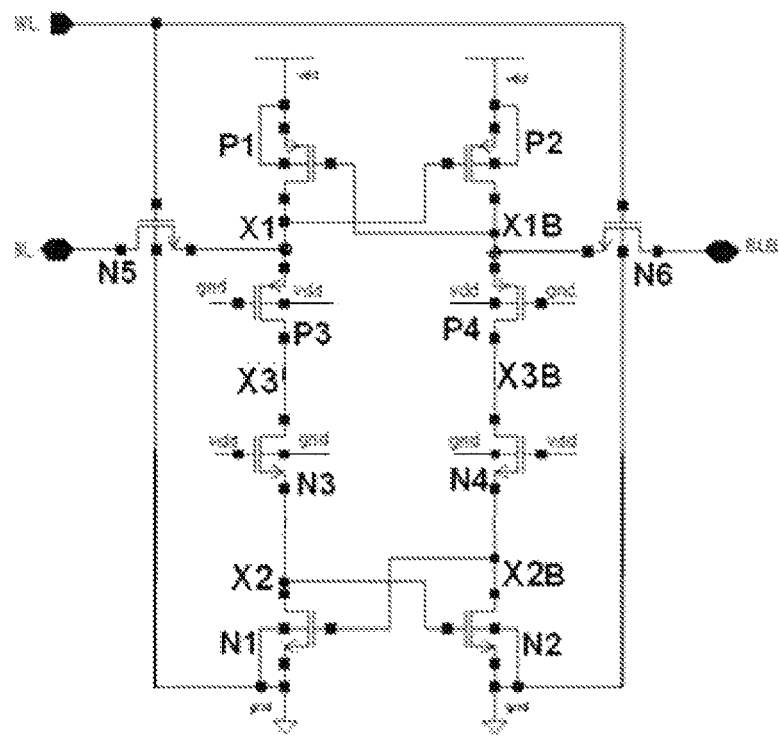
FIG. 8 is a circuit diagram of a third embodiment of the present invention.

As shown in FIG. 8, a drain of N5 is connected to X1, a drain of N6 is connected to X1B; a source of N5 is connected to a bit line BL, a source of N6 is connected to a complementary bit line BLB; gates of N5 and N6 are connected to each other and are connected to a word line WL.

By means of the three embodiments of the present invention, without obviously increasing complexity and merely increasing a small amount of area, the memory cell of the static random access memory can be prevented from having single event upset in a radiation environment, meanwhile, they are compatible with the universal CMOS technology and are easily implementable.

The above described specific embodiments further illustrate the object, technical solution and beneficial effects of the present invention. It shall be understood that the above-mentioned are merely specific embodiments of the present invention and do not intend to limit the same. Any modification, equivalent substitution and improvement made according to the spirit and principle of the present invention shall fall into the protection scope of the present invention.

The invention claimed is:

1. A memory cell of static random access memory based on resistance reinforcement comprising a latch circuit and a bit selection circuit, characterized in that the latch circuit consists of two PMOS transistors P1 and P2, two NMOS transistors N1 and N2, a first resistance-capacitance network and a second resistance-capacitance network; the bit selection circuit consists of NMOS transistors N5 and N6; the latch circuit forms four storage nodes X1, X1B, X2, X2B;

wherein the first resistance-capacitance network consists of a resistor R1 and a capacitor C1, and the second resistance-capacitance network consists of a resistor R2 and a capacitor C2;

wherein a drain of P1 is connected to X1, a source thereof is connected to a power supply, and a gate thereof is connected to X1B; an input terminal and an output terminal of the first resistance-capacitance network are connected to X1 and X2 respectively, a first terminal of the capacitor C1 of the first resistance-capacitance network being connected to ground and a second terminal of the capacitor C1 of the first resistance-capacitance network being connected to the terminal X1; a drain of N1 is connected to X2, a source thereof is connected to the ground, and a gate thereof is connected to X2B;

wherein a drain of P2 is connected to X1B, a source thereof is connected to a power supply, and a gate thereof is connected to X1; an input terminal and an output terminal of the second resistance-capacitance network are connected to X1B and X2B respectively, a first terminal of the capacitor C2 of the second resistance-capacitance network being connected a ground and a second terminal of the capacitance C2 of the second resistance-capacitance network connected to the terminal X1B; a drain of N2 is connected to X2B, a source thereof is connected to the ground, and a gate thereof is connected to X2;

wherein a drain of N5 is connected to X2 or X1, a drain of N6 is accordingly connected to X2B or X1B; a source of N5 is connected to a bit line BL; a source of N6 is connected to a complementary bit line BLB; gates of N5 and N6 are connected to each other and are connected to a word line WL.

2. The memory cell of static random access memory based on resistance reinforcement according to claim 1, characterized in that
wherein two terminals of the resistor R1 are connected to X1 and X2 respectively;
wherein two terminals of the resistor R2 are connected to X1B and X2B respectively.

3. The memory cell of static random access memory based on resistance reinforcement according to claim 1, characterized in that the first resistance-capacitance network consists of a PMOS transistor P3 and an NMOS transistor N3 that are always on so as to act as resistance-capacitance isolation nodes, and the second resistance-capacitance network consists of a PMOS transistor P4 and an NMOS transistor N4 that are always on so as to act as resistance-capacitance isolation nodes;
wherein a storage node X3 is formed between P3 and N3; and a storage node X3B is formed between P4 and N4;
wherein a source of P3 is connected to X1, a drain thereof is connected to X3, a gate thereof is connected to the ground, and its substrate is connected to a power supply, so that it is always on; a drain of N3 is connected to X3, a source thereof is connected to X2, a gate thereof is connected to a power supply and a substrate thereof is connected to the ground, so that it is always on;
wherein a source of P4 is connected to X1B, a drain thereof is connected to X3B, a gate thereof is connected to the ground, and its substrate is connected to a power supply, so that it is always on; a drain of N3 is connected to X3B, a source thereof is connected to X2B, a gate thereof is connected to a power supply and a substrate thereof is connected to the ground, so that it is always on.

4. The memory cell of static random access memory based on resistance reinforcement according to claim 1, wherein the first resistance-capacitance network is connected in parallel with the second resistance-capacitance network.

5. The memory cell of static random access memory based on resistance reinforcement according to claim 1, wherein the capacitor of the first resistance-capacitance network is directly connected to the ground.

6. The memory cell of static random access memory based on resistance reinforcement according to claim 1, wherein the first resistance-capacitance network is connected in series with points X1 and X2 and the second resistance-capacitance network is connected in series with points X1B and X2B.

7. A memory cell of static random access memory based on resistance reinforcement comprising a latch circuit and a bit selection circuit, characterized in that the latch circuit includes two PMOS transistors P1 and P2, two NMOS transistors N1 and N2, a first resistance-capacitance network and a second resistance-capacitance network; the bit selection circuit includes NMOS transistors N5 and N6; the latch circuit forms four storage nodes X1, X1B, X2, X2B;
wherein the first resistance-capacitance network consists of a resistor R1 and a capacitor C1, and the second resistance-capacitance network consists of a resistor R2 and a capacitor C2;
wherein a drain of P1 is connected to X1, a source thereof is connected to a power supply, and a gate thereof is connected to X1B; an input terminal and an output terminal of the first resistance-capacitance network are connected to X1 and X2 respectively, the first resistance-capacitance network being directly connected to a ground such that a terminal of the capacitor C1 of the first resistance-capacitance network being connected to a ground and second terminal of the capacitor C1 of the first resistance-capacitance network is connected to the terminal X1; a drain of N1 is connected to X2, a source thereof is connected to the ground, and a gate thereof is connected to X2B;
wherein a drain of P2 is connected to X1B, a source thereof is connected to a power supply, and a gate thereof is connected to X1; an input terminal and an output terminal of the second resistance-capacitance network are connected to X1B and X2B respectively, a first terminal of the capacitor C2 of the second resistance-capacitance network being connected a ground and a second terminal of the capacitance C2 of the second resistance-capacitance network connected to the terminal X1B; a drain of N2 is connected to X2B, a source thereof is connected to the ground, and a gate thereof is connected to X2;
wherein a drain of N5 is connected to X2 or X1, a drain of N6 is accordingly connected to X2B or X1B; a source of N5 is connected to a bit line BL; a source of N6 is connected to a complementary bit line BLB; gates of N5 and N6 are connected to each other and are connected to a word line WL.

8. The memory cell of static random access memory based on resistance reinforcement according to claim 7, characterized in that
wherein two terminals of the resistor R1 are connected to X1 and X2 respectively;
wherein two terminals of the resistor R2 are connected to X1B and X2B respectively.

9. The memory cell of static random access memory based on resistance reinforcement according to claim 7, characterized in that the first resistance-capacitance network consists of a PMOS transistor P3 and an NMOS transistor N3 that are always on so as to act as resistance-capacitance isolation nodes, and the second resistance-capacitance network consists of a PMOS transistor P4 and an NMOS transistor N4 that are always on so as to act as resistance-capacitance isolation nodes;

wherein a storage node X3 is formed between P3 and N3; and a storage node X3B is formed between P4 and N4;

wherein a source of P3 is connected to X1, a drain thereof is connected to X3, a gate thereof is connected to the ground, and its substrate is connected to a power supply, so that it is always on; a drain of N3 is connected to X3, a source thereof is connected to X2, a gate thereof is connected to a power supply and a substrate thereof is connected to the ground, so that it is always on;

wherein a source of P4 is connected to X1B, a drain thereof is connected to X3B, a gate thereof is connected to the ground, and its substrate is connected to a power supply, so that it is always on; a drain of N3 is connected to X3B, a source thereof is connected to X2B, a gate thereof is connected to a power supply and a substrate thereof is connected to the ground, so that it is always on.

* * * * *